United States Patent [19]

Yamaguchi et al.

[11] Patent Number: 5,250,384
[45] Date of Patent: Oct. 5, 1993

[54] LIGHT-SENSITIVE HEAT-SENSITIVE COMPOSITION AND RECORDING MATERIAL COMPRISING SAME AND IMAGE FORMATION PROCESS USING SAME

[75] Inventors: Jun Yamaguchi; Sadao Ishige; Takekatsu Sugiyama, all of Shizuoka, Japan

[73] Assignee: Fuji Photo Film Co., Ltd., Kanagawa, Japan

[21] Appl. No.: 676,478

[22] Filed: Mar. 27, 1991

Related U.S. Application Data

[63] Continuation of Ser. No. 453,734, Dec. 20, 1989, abandoned.

[30] Foreign Application Priority Data

Dec. 20, 1988 [JP] Japan .................. 63-321429

[51] Int. Cl.$^5$ .................................................. G03C 1/72
[52] U.S. Cl. ........................... 430/138; 430/200; 430/203; 430/281; 430/292; 430/330; 430/332; 430/351; 430/926; 430/964; 503/202
[58] Field of Search ............... 430/617, 619, 138, 200, 430/203, 270, 281, 330, 348, 350, 926, 292, 332, 617, 619, 351, 964; 503/214, 202

[56] References Cited

U.S. PATENT DOCUMENTS

| | | | |
|---|---|---|---|
| 3,694,208 | 9/1972 | Ranz et al. | 430/292 |
| 3,951,658 | 4/1976 | Marsh et al. | 430/292 |
| 4,251,619 | 2/1981 | Kurita | 430/292 |
| 4,258,118 | 3/1981 | Foley et al. | 430/383 |
| 4,258,119 | 3/1981 | Cournoyer et al. | 430/383 |
| 4,283,458 | 8/1981 | Igarashi et al. | 503/217 |
| 4,524,128 | 6/1985 | Edwards et al. | 430/617 |
| 4,740,455 | 4/1988 | Kubodera et al. | 430/617 |
| 4,758,496 | 7/1988 | Kakimi | 430/203 |
| 4,760,011 | 7/1988 | Kakimi | 430/617 |

Primary Examiner—Marion E. McCamish
Assistant Examiner—Janis L. Dote
Attorney, Agent, or Firm—Sughrue, Mion, Zinn, Macpeak & Seas

[57] ABSTRACT

A novel light-sensitive heat-sensitive composition is disclosed, comprising a photohardenable composition, a dye which discolors upon reacting with a base, and a base precursor. A novel light-sensitive heat-sensitive recording material is also disclosed, comprising a support having provided thereon the above described light-sensitive heat-sensitive composition. In a preferred embodiment, the dye is a spectral sensitizing dye for the photohardenable composition. Furthermore, a novel image formation process is disclosed, comprising the steps of: (a) imagewise exposing the light-sensitive heat-sensitive recording material to light to cure the exposed portions of the recording material; and (b) uniformly heating the imagewise exposed recording material to discolor the dye in the unexposed portions thereof. A second image formation process is disclosed, comprising the steps of: (a) imagewise heating the light-sensitive heat-sensitive recording material to discolor the dye in the heated portions of the recording material; and (b) uniformly exposing the imagewise heated recording material to light to cure the unheated portions thereof.

10 Claims, No Drawings

LIGHT-SENSITIVE HEAT-SENSITIVE COMPOSITION AND RECORDING MATERIAL COMPRISING SAME AND IMAGE FORMATION PROCESS USING SAME

This is a continuation of application Ser. No. 07/453,734 filed Dec. 20, 1989 now abandoned.

FIELD OF THE INVENTION

The present invention relates to a novel light-sensitive heat-sensitive composition utilizing photothermography which can be used in copier, facsimile, printer, label, color proof, over head projector, second original or the like applications. Additionally, the present invention relates to a recording material comprising the composition, and an image formation process using the composition. More particularly, the present invention relates to a novel light-sensitive heat-sensitive composition sensitive to visible light, and utilizing a photohardenable reaction and a reaction of discoloration of a dye by contact with a base; a monosheet type recording material comprising the light-sensitive heat-sensitive composition which requires no expendables; and an image formation process using the light-sensitive heat-sensitive composition.

BACKGROUND OF THE INVENTION

Photothermography (light-sensitive heat-sensitive image formation process) comprises imagewise exposure of a recording material and subsequent uniform heating to develop the exposed recording material. The process is characterized in that images are simply obtained in a single dry process.

Such an image formation process is disclosed in JP-A-52-89915 (the term "JP-A" as used herein means an "unexamined published Japanese patent application"). In this process, a recording material comprising a photopolymerizable composition and heat-sensitive color forming components is subjected to heat development to form a visible image. Specifically, two components of a two-component type heat-sensitive color forming material are provided on a photopolymerizable composition on either the inner side or the outer side thereof, or separately on the inner side and the outer side thereof, to provide a recording material. The recording material thus prepared is exposed to light and heated. As a result, the portion which has been hardened by exposure prevents the heat-sensitive components from reacting such that color is not formed, while the heat-sensitive components in the unexposed portion are mobile upon heating and react to form a color image.

The recording material disclosed in JP-A-61-123838 comprises a photopolymerizable composition consisting of a vinyl monomer containing an acidic group and a photopolymerization initiator, and a dye precursor which produces a dye upon reaction with an acid. In this image formation process, the recording material is imagewise exposed to light and then uniformly heated while being brought into close contact with the dye precursor. The diffused unpolymerized monomer containing an acidic group and the dye precursor react to form an image.

An image formation process disclosed in JP-A-61-120143 comprises imagewise exposing to light a recording material comprising a photohardenable composition, a dye which can be bleached and a bleaching agent which can bleach the dye to cure the exposed portions of the recording material, and then uniformly heating the material to bleach the dye by the reaction of the dye with the bleaching agent in the uncured portions to form an image. As the bleaching agent, a reducing agent or a oxidizing agent is used in the image formation process. Such image formation process is also disclosed in JP-A-60-119552, JP-A-60-120352, JP-A-60-120353 and JP-A-60-120354. In these references, polymerizable vinyl monomer is used as the reducing agent.

Depending on the particular design, these recording materials can use either ultraviolet light or visible light (e.g., visible light laser or LED) as an exposure service.

For recording with ultraviolet light, these recording materials can take the form of either a two sheet transfer type material or preferably a monosheet type material not requiring an extra sheet. However, a monosheet type material cannot be used for recording with visible light.

In order to record with visible light, a colored spectral sensitizer for absorbing visible light and initiating photopolymerization is required. If used in monosheet form, the colored spectral sensitizer remains therein, thereby resulting in an unclear image.

SUMMARY OF THE INVENTION

An object of the present invention is to provide a recording material wherein a polymer image obtained by photohardening is converted (developed) to a visible image by heat treatment, and an image formation process using the recording material.

A second object of the present invention is to provide a recording material sensitive to visible light, and an image formation process using the recording material.

A third object of the present invention is to provide a monosheet type recording material which does not require the use of an image transfer sheet.

These and other objects of the present invention are apparent from the following detailed description and Examples.

The objects of the present invention are attained by a light-sensitive heat-sensitive composition, comprising (a) a photohardenable composition, (b) a dye which discolors upon reacting with a base, and (c) a base precursor; a recording material comprising a support having provided thereon a layer containing the light-sensitive heat-sensitive composition; and an image formation process employing a recording material comprising the light-sensitive heat-sensitive composition.

DETAILED DESCRIPTION OF THE INVENTION

The photohardenable composition used in the present invention is a composition which increases a molecular weight thereof, cures, and lowers a fluidity thereof when the composition was exposed to light.

Examples of the photohardenable composition for use in the present invention includes a photopolymerizable composition comprising a polymerizable vinyl monomer and a photopolymerization initiator, or a composition comprising a photo-crosslinkable resin, or mixtures thereof.

A first image formation process of the present invention comprises imagewise exposing to light a recording material comprising a support having provided thereon a layer containing a photohardenable composition, a dye which discolors upon reacting with a base, and a base precursor to cure the exposed portions of the recording material, and then uniformly heating the material such that the base produced from the base precursor discolors the dye in the uncured portions thereof. In another embodiment, the process of the present invention comprises imagewise heating the recording material to thereby form a base from the base precursor which discolors the dye in the heated portions of the recording material, and then uniformly exposing the material to light such that the unheated portion become cured.

The base generated in the heated portions does not diffuse into the cured portions so the cured portions remain colored.

In the present invention, the discoloration of the dye is occurred by a reverse reaction of a color formation reaction. More specifically, the dye used in the present invention discolors by a closing reaction of the lactone ring of the dye in which the lactone ring has been opened to that the dye has been colored.

In the present invention, the dye in the heated and uncured portion of the recording material is discolored, while the dye in the cured portion provides a color image. A monosheet type light-sensitive material is therefore obtained which is technically difficult to achieve in conventional systems which do not employ the discoloration of a dye.

Furthermore, since the recording material of the present invention contained therein a base precursor which produces a base upon heating to thereby discolor the dye, the material has excellent preservability prior to being exposed. During storage, the base precursor does not react with the dye. Therefore, the dye remains stable in the light-sensitive material. When the light-sensitive material is heated after exposure, the resulting base readily discolors the dye.

The recording material of the present invention can take various forms depending on the intended application.

A preferred embodiment comprises a support having provided thereon a layer containing in admixture of a photohardenable composition, a dye, a binder, and microcapsules containing a base precursor or dispersion thereof. The microcapsules inhibit unnecessary contact of the base precursor with the dye, and improve the preservability of the recording material in unexposed form.

Another preferred embodiment comprises a support having provided thereon a first layer comprising a photohardenable composition, a dye and a binder, and a second layer adjacent to the first layer containing a base precursor or dispersion thereof.

In this case, an intermediate layer may be provided in the light-sensitive material between the first and second layers to improve the preservability of the recording material in unexposed form.

The intermediate layer which may be used in the present invention is a layer which is capable of isolating the layer containing the spectral sensitizing dye from the layer containing the base precursor. As the intermediate layer, a layer comprising various polymers such as gelatin or polyvinyl alcohol, and having a thickness of from about 0.1 to about 10 μm, can be used in the present invention.

A further preferred embodiment comprises a support having provided thereon a layer comprising minute droplets containing a light-sensitive heat-sensitive composition comprising a photohardenable composition and a dye, and a base precursor dispersion. In this case, the droplets may be contained as the core material of microcapsules.

Examples of photohardenable compositions for use in the present invention include the various compositions known in the art. Reference is made, for example, to Kosar, *Light-sensitive Systems,* Chapters 2, 3, 4 and 5, John Wiley & Sons, Inc. (1986); and Nihon Shashin Gakkai, *Shashin Kogaku no Kiso - Higinenshashinhen,* p 133-156 (1982).

Examples of the photo-crosslinkable resin for use in the present invention include vinyl polycinnamate, vinyl polycinnamilideneacetate, and a light-sensitive resin containing an α-phenylmaleimide group.

The present invention is further described mainly with reference to a preferred embodiment comprising a support having provided thereof a layer comprising a photopolymerizable composition containing a polymerizable vinyl monomer and a photopolymerization initiator, a dye which discolors upon reaction with a base, and a binder, and a base precursor dispersed therein, but the present invention is not to be construed as being limited thereto.

The polymerizable vinyl monomer for use in the photopolymerizable composition of the present invention include a compound which occurs radical polymerization upon reacting with a radical which is generated from a photopolymerization initiator when exposed to light, and a compound containing at least one ethylenically unsaturated double bond per molecule. Examples of such polymerizable compounds or reactive groups contained in such compounds include acrylic acid and salts thereof, acrylic esters, acrylamides, methacrylamides, maleic anhydride, maleic esters, itaconic acid, itaconic esters, styrenes, vinyl ethers, vinyl esters, N-vinyl heterocyclic groups, arylethers, and allylesters.

Particularly preferred among these compounds are polymerizable compounds containing a plurality of ethylenically unsaturated double bonds per molecule (polyfunctional monomers). Examples of such polymerizable compounds include acrylic or methacrylic esters of polyhydric,alcohols such as trimethylol propane and pentaerythritol; acrylate- or methacrylate-terminated epoxy resins; and acrylate- or methacrylate-terminated polyesters. Particularly preferred typical examples of such compounds include ethylene glycol diacrylate, ethylene glycol dimethacrylate, trimethylol propane-triacrylate, pentaerythritol tetraacrylate, dipentaerythritol hydroxypentaacrylate, hexanediol-1,6-dimethacrylate, and diethylene glycol dimethacrylate.

The molecular weight of the polymerizable vinyl monomer is preferably in the range of from about 100 to about 5,000, and more preferably from about 300 to about 2,000.

The content of the polymerizable vinyl monomer is preferably at least 10% by weight, more preferably at least 15% by weight, and still more preferably at least 60% by weight based on the total weight of the photopolymerizable composition. If the content of the monomer is less than 10% by weight, the difference in the degree of hardening between the exposed portions and the unexposed portions is too small to provide good image quality.

Photopolymerization initiators preferably used in the present invention include compounds which initiate photopolymerization of the above-described compounds containing an ethylenically unsaturated bond, alone or in combination.

Useful preferred examples of such photopolymerization initiators include aromatic ketones (e.g., benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-tert-butylanthraquinone, 2-methylanthraquinone, xanthone, thioxanthone, 2-chlorothioxanthone, 2,4-diethylthioxanthone, fluorenone, acrydone), benzoin and benzoinethers (e.g, benzoin methyl ether, benzoin ethyl ether, benzoin isopropyl ether, benzoin phenyl ether), 2,4,5-triarylimidazole dimer (e.g., 2-(o-chlorophenyl)-4,5-diphenylimidazole dimer, 2-(o-chlorophenyl)-4,5-bis(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer), polyhalogen compound (e.g., carbon tetrabromide, phenyl tribromomethyl sulfone, phenyl trichloromethyl ketone), the compounds described in JP-A-53-133428 (corresponding to U.S. Pat. No. 4,189,323), JP-B-57-1819 (corresponding to U.S. Pat. No. 3,954,475) and JP-B-57-6096 (corresponding to U.S. Pat. No. 4,212,970), and U.S. Pat. No. 3,615,455, S-triazine derivatives containing a trihalogen-substituted methyl group as described, for example, in JP-A-58-29803 (e.g., 2,4,6-tris(trichloromethyl)-S-triazine, 2-methoxy-4,6-bis(trichloromethyl)-S-triazine, 2-amino-4,6-bis(trichloromethyl)-S-triazine, 2-(P-methoxystyryl)-4,6-bis(trichloromethyl)-S-triazine), organic peroxides as described in JP-A-59-189340 (e.g., methyl ethyl ketone peroxide, cyclohexanone peroxide, 3,3,5-trimethylcyclohexanone peroxide, benzoyl peroxide, ditertiary butyl diperoxy isophthalate, 2,5-dimethyl-2,5-di(benzoylperoxy)hexane, tertiary butyl peroxy benzoate, α,α'-bis(tertiary butyl peroxy isopropyl)benzene, dicumyl peroxide, 3,3',4,4'-tetra(tertiary-butylperoxycarbonyl)benzophenone), azinium salt compounds as described in U.S. Pat. No. 4,743,530, organic boron compounds as described in European Patent 0,223,587 (e.g., tetramethylammonium salt of triphenylbutyl borate, tetrabutylammonium salt of triphenylbutyl borate, tetramethylammonium salt of tris(P-methoxyphenyl)butyl borate), diaryl iodonium salt, iron allene complex, and other photopolymerization initiators known in the art.

The photopolymerization initiator may comprise a combination of two or more compounds. Examples of such a combination of two or more compounds include a combination of 2,4,5-triarylimidazole dimer and mercaptobenzoxazole, a combination of 4,4'-bis(dimethylamino)benzophenone and benzophenone or benzoin methyl ether as described in U.S. Pat. No. 3,427,161, a combination of benzoyl-N-methylnaphthothiazoline and 2,4- bis(trichloromethyl)-6-(4'-methoxyphenyl)-triazole as described in U.S. Pat. No. 4,239,850, a combination of dialkylaminobenzoic ester and dimethylthioxanthone as described in JP-A-57-23602, and a combination of 4,4'-bis(dimethylamino)benzophenone, benzophenone and polyhalogenated methyl as described in JP-A-59-78339 (corresponding to U.S. Pat. No. 4,584,260). Preferred examples of such combinations include a combination of 4,4'-bis(diethylamino)benzophenone and benzophenone, a combination of 2,4-diethylthioxanthone and 4-dimethylaminobenzoic ethyl, and a combination of 4,4'- bis(diethylamino)benzophenone and 2,4,5-triarylimidazole dimer.

Particularly preferred among these photopolymerization initiators are the S-triazine derivatives containing a trihalogen-substituted methyl group, organic peroxides, azinium salt compounds, and organic boron compounds.

The content of the photopolymerization initiator is preferably in the range of from 0.1 to 20% by weight, more preferably from 0.2 to 15% by weight, and particularly preferably from 5 to 10% by weight based on the total weight of the photopolymerizable composition. If the amount of the photopolymerization initiator is less than 0.1% by weight, the sensitivity of the photopolymerizable composition is insufficient. On the contrary, if the amount of the photopolymerization initiator exceeds 10% by weight, further increases in the sensitivity are not achieved.

In order to spectral sensitize the photopolymerization initiator, a spectral sensitizing dye is preferably incorporated into the photopolymerizable composition of the present invention. In this case, it is particularly preferable that the dye which discolors upon reacting with a base is the spectral sensitizing dye for the photopolymerization initiator.

Methods for spectral sensitizing the photopolymerization initiator are disclosed, for example, in U.S. Pat. Nos. 4,772,541 and 4,800,149 as for spectral sensitizing the organic boron compounds; in U.S. Pat. Nos. 4,743,530, 4,743,529 and 4,743,528, as for spectral sensitizing the azinium salt compounds; and in U.S. Pat. No. 4,351,893 as for spectral sensitizing the 2,4,5-triarylimidazole dimers.

Examples of the spectral sensitizing dye for use in the present invention which discolors upon reacting with a base include compounds obtained by the coloration of triarylmethane compounds, diphenylmethane compounds, xanthene compounds, thiazine compounds, spiropyrane compounds or the like with an acidic compound such as an inorganic acid (e.g., hydrochloric acid, sulfuric acid, phosphoric acid, bromic acid, hydrogen iodide, perchloric acid), acetic acid, alkylsulfonic acid, alkylbenzenesulfonic acid, naphthalenesulfonic acid, perfluoroalkylsulfonic acid, phenolic compound or salicylic acid derivative and polyvalent metal salt thereof.

Useful examples of dyes obtained by the coloration of compounds as described in JP-A-55-027253 include triarylmethane compounds (e.g., 3,3-bis(p-dimethylaminophenyl)-6-dimethylaminophthalide, 3,3-bis(p-dimethylaminophenyl)phthalide, 3-(p-dimethylaminophenyl)-3-(1,3-dimethylindole-3-yl)phthalide, 3-(p-dimethylaminophenyl)-3-(2-methylindole-3-yl)phthalide, 3,3-bis(1-octyl-2-methylindole-3-yl)phthalide), diphenylmethane compound (e.g., 4,4'-bis-dimethyl aminobenzhydryl benzyl ether, N-halphenyl-leucoauramine, N-2,4,5-trichlorophenyl leucoauramine), xanthene compound (e.g., rhodamine-B-anilinolactum, rhodamine-B-(p-nitroanilino)lactum, 2-(dibenzylamino)-6-diethylaminofluoran,2-anilino-3-methyl-6-diethylaminofluoran, 2-anilino-3-methyl-6-dibutylaminofluoran, 2-anilino-3-methyl-6-N-ethyl-N-isoamylfluoran, 2-anilino-3-methyl-6-N-methyl-N-cyclohexylaminofluoran, 2-anilino-3-chloro-6-diethylaminofluoran, 2-anilino-3-methyl-6-N-ethyl-N-isobutylaminofluoran, 2-anilino-dibutylaminofluoran, 2-anilino-3-methyl-6-N-methyl-N-tetrahydrofurfurylaminofluoran, 2-anilino-3-methyl-6-piperidinoaminofluoran, 2-(o-chloroanilino)-6-diethylaminofluoran, 2-(3,4-dichloroanilino)-6-diethylaminofluoran), thiazine compound (e.g., benzoylleucomethylene blue, p-nitrobenzoylleucomethylene blue), and spiro compound (e.g., 3-methyl-spiro-di-α-naphthopyran, 3-ethyl-spiro-di-α-naphthopyran, 3,3'-dichloro-spiro-di-α-naphthopyran, 3-benzyl-spiro-di-α-naphthopyran, 3-methyl-spiro-α-naphtho-(3-methoxy-α-benzo)pyran, 3-propyl-spiro-dibenzopyran).

Each amount of the dye and the spectral sensitizing dye, and the ratio of the dye and the spectral sensitizing dye in the present invention cannot be stated in general since the amounts and the ratio are varied depending upon characteristics of these components. However, in functionally, the dye is preferably contained in an amount so that an optical density of the resulting image can be obtained within the range of form 1 to 2, and the spectral sensitizing dye is preferably contained in an amount so that an optical density of the resulting image can be obtained within the range of from 0.3 to 2.0, in the light-sensitive heat-sensitive composition of the present invention.

The base precursors for use in the present invention preferably include salts of base and organic acids which undergo decarboxylation upon heating, compounds which undergo intramolecular nucleophilic substitution reaction, Lossen rearrangement, Beckmann rearrangement or the like to release an amine, or other compounds which undergo a reaction upon heating to release a base. Useful examples of such base precursors include the salts of a base such as guanidine, triphenyl guanidine, tricyclohexyl guanidine, piperidine, morpholine, P-toluidine or 2-picoline with an acid such as acetic acid, trichloroacetic acid, phenylsulfonylacetic acid, 4-methylsulfonylphenylsulfonylacetic acid, 4-acetylaminomethylpropionic acid, oxalic acid, maleic acid, succinic acid, fumaric acid, carbonic acid or bicarbonic acid.

The base precursors may be incorporated in the layer containing the dye which discolors upon reacting with the base as a solid dispersion of particulates. Alternatively, the base precursors may be incorporated in a layer other than the layer containing the dye which discolors upon reacting with the base, in microcapsuled form or as a solution in oil solution. The base precursor may be located anywhere in the recording material as long as the base produced thereby upon heating discolors the dye.

The amount of the base precursor incorporated into the photopolymerizable composition of the present invention is preferably in the range of from 1 to 100 mols, and more preferably from 1 to 5 mols per mol of the dye. If the amount is less than 1 mol per mol of the spectral sensitizing dye, the dye is not sufficiently discolored upon heating of the recording material.

The encapsulation of a base precursor dispersion or base precursor in microcapsules may be accomplished by any method known in the art as described, for example, in U.S. Pat. No. 4,743,528, and JP-A-61-279593 (corresponding to U.S. Pat. No. 4,686,547), JP-A-59-190886 (corresponding to U.S. Pat. No. 4,650,740), JP-A-60-6493 (corresponding to U.S. Pat. No. 4,650,740), and JP-A-61-279593 (corresponding to U.S. Pat. No. 4,686,547).

The present photopolymerizable composition may also be microencapsulated. When the photopolymerizable composition is microencapsulated, either a dye which discolors upon reacting with a base or a base precursor is microencapsulated together with a photohardenable composition in the same microcapsule. In particular, it is preferable that the dye and the photohardenable composition are microencapsulated in the same microcapsule. The encapsulation of the photopolymerizable composition of the present invention in microcapsules may be accomplished by any suitable method as described, for example, in European Patent 0,223,587 and the patents cited above. The mean grain diameter of the microcapsules is preferably 20 μm or less. In general, if the grain diameter exceeds 20 μm, the print quality may deteriorate. In order to avoid pressure fogging upon handling, the particle diameter is preferably 8 μm or less.

In addition to the above-noted compounds, a heat polymerization inhibitor may be incorporated into the photopolymerizable composition. The heat polymerization inhibitor inhibits heat polymerization or polymerization of the photopolymerizable composition which occurs slowly over time, to improve the chemical stability thereof during preparation or storage. Useful examples of the heat polymerization inhibitor include p-methoxyphenol, hydroquinone, t-butylcatechol, pyrogallol, 2-hydroxybenzophenone, 4-methoxy-2-hydroxybenzophenone, cuprous chloride, phenothiazine, chloranil, naphthylamine, β-naphthol, 2,.6-di-t-butyl-p-cresol, nitrobenzene, dinitrobenzene, picric acid, and p-toluidine.

The amount of the heat polymerization inhibitor to be incorporated in the present invention is preferably in the range of from 0.001 to 5% by weight, and more preferably from 0.01 to 1% by weight based on the total weight of photopolymerizable composition. If the amount is less than 0.001% by weight, the heat polymerization inhibitor is ineffective in promoting the thermal stability of the recording material. If the amount exceeds 5% by weight, the heat polymerization inhibitor reduces the sensitivity of the recording material.

A polymer binder may be incorporated into the photopolymerizable composition of the present invention. The polymer binder for use in the present invention includes a natural or synthetic high molecular weight compound or high molecular weight latex known in the art. Useful examples include water-soluble high molecular weight compounds (e.g., gelatin, polyvinyl alcohol, hydroxyethyl cellulose, polyvinyl pyrrolidone, casein, starch), solvent-soluble high molecular weight compounds (e.g., polystyrene, polyvinyl formal, polyvinyl butyral, acrylic resin such as polymethyl acrylate, polybutyl acrylate, polymethyl methacrylate, polybutyl methacrylate or copolymers thereof, phenolic resin, styrene-butadiene resin, ethyl cellulose, epoxy resin, urethane resin), and high molecular weight latexes thereof.

The photopolymerizable composition of the present invention and the constituent components thereof can be coated on a desired support as a solution in a solvent, and then allowed to dry to obtain the recording material of the present invention. Examples of solvents for use herein include water, alcohol (e.g., methanol, ethanol, n-propanol, isopropanol, n-butanol, sec-butanol, methyl cellosolve, 1-methoxy-2-propanol), halogen solvents (e.g., methylene chloride, ethylene chloride), ketone (e.g., acetone, cyclohexanone, methyl ethyl ketone), esters (e.g., ethylene glycol monomethyl ether acetate, ethyl acetate, methyl acetate), toluene, xylene, and mixture thereof. The coating of the photopolymerizable compositions onto a support may be accomplished by means of a blade coater, rod coater, knife coater, roll doctor coater, comb coater, reverse roll coater, transfer roll coater, gravure coater, kiss-roll coater, curtain coater, extrusion coater or the like. The thickness of the recording layer is preferably in the range of from 0.1 to 50 μm.

The recording material of the present invention can be used in various applications such as a copier, facsimile, printer, label, color proof, over head projector, and second original. Examples of support materials for use in the recording material of the present invention include paper, coated paper, laminated, paper, synthetic paper, transparent film such as polyethylene terephthalate film, cellulose triacetate film, polyethylene film, polystyrene film or polycarbonate film, metallic plate such as zinc or copper, and materials obtained by subjecting these support materials to various treatments such as surface treatment, undercoating and sputtering of metal. These support materials may further comprise a sliding layer, antistatic layer, anticurling layer, adhesive layer or the like depending on the particular application.

The recording material of the present invention enables high sensitivity recording in a wide wavelength range of light from visible light to near infrared rays. Light sources for use in exposing the recording material of the present invention include, for example, a mercury vapor lamp, xenon lamp, tungsten lamp, metal halide lamp, argon laser, helium laser, LED, and fluorescent lamp. Furthermore, a monosheet recording material wherein the dye is discolored to provide sharp images without color stain is obtained. Moveover, since the base which discolors the dye is used in the form of a precursor, the unexposed recording material has excellent storage properties.

The present invention is further described in the following examples, but the present invention should not be construed as being limited, thereto.

EXAMPLE 1

0.09 g of bis[(1-octyl-2-methyl)indole-3-yl]-2-hydroxycarbonylphenyl carbonium perchlorate as a spectral sensitizing dye which discolors upon reaction with a base and 0.054 g of triphenylbutyl borate tetramethyl ammonium salt as a photopolymerization initiator were dissolved in 15 g of trimethylol propane triacrylate as a polymerizable monomer. 0.2 g of a finely divided powder of the carbonate of tricyclohexyl guanidine as a base precursor was uniformly dispersed in the solution. 15 g of a 33% acetone solution of polymethyl methacrylate was added to the solution and well stirred to prepare a coating solution. The coating solution was then coated on a high quality paper (meter basis weight; 60 g/m$^2$) by means of a coating bar in a dry weight amount of 3 g/m$^2$ to obtain the coated recording layer. The coated sample was then dried at a temperature of 50° C. for 1 minute. An aqueous solution of polyvinyl alcohol was coated over the recording layer to form an oxygen barrier in a dry weight amount of 3 g/m$^2$. The material was then dried at a temperature of 50° C. for 5 minutes to obtain a light-sensitive heat-sensitive recording material.

The light-sensitive heat-sensitive recording material thus obtained was then exposed to light from a 500 W xenon lamp through a step wedge (Fuji Step Guide P, trade name, manufactured by Fuji Photo Film Co., Ltd.) and a 550-nm interference filter (Type MIF interference filter, manufactured by Nippon Shinku Kogaku K.K.). The recording material was then heated on a heating plate, the heating plate being at a temperature of 150° C., for 30 seconds. As a result, a sharp magenta image was obtained on the recording material.

EXAMPLE 2

0.09 g of bis[(1-octyl-2-methyl)indole-3-yl]-2-hydroxycarbonylphenyl carbonium dodecylbenzenesulfonate as a spectral sensitizing dye which discolors upon reaction with a base and 0.2 g of IRGACURE 651 (trade name, manufactured by CIBA-GEIGY) as a photopolymerization initiator were dissolved in 15 g of trimethylol propane triacrylate as a polymerizable monomer. 0.2 g of a finely divided powder of the carbonate of tricyclohexyl guanidine as a base precursor was uniformly dispersed in the solution. 15 g of a 33% acetone solution of polymethyl methacrylate was added to the solution and well stirred to prepare a coating solution. The coating solution was then coated on a high quality paper (meter basis weight: 60 g/m$^2$) by means of a coating bar in a dry weight amount of 3 g/m$^2$ to obtain the coated recording layer. The coated sample was then dried at a temperature of 50° C. for 1 minute. An aqueous solution of polyvinyl alcohol was coated over the recording layer to form an oxygen barrier in a dry weight amount of 3 g/m$^2$. The material was then dried at a temperature of 50° C. for 5 minutes to obtain a light-sensitive heat-sensitive recording material.

The light-sensitive heat-sensitive recording material thus obtained was then exposed to ultraviolet light from a 1,000 W high pressure mercury lamp (Jet Light, manufactured by ORC Co., Ltd.) through a step wedge. The recording material was then heated on a heating plate, the heating plate being at a temperature of 150° C., for 30 seconds. As a result, a sharp magenta image was obtained on the recording material.

EXAMPLE 3

0.09 g of bis[(1-octyl-2-methyl)indole-3-yl]-2-hydroxycarbonylphenyl carbonium dodecylbenzenesulfonate as a spectral sensitizing dye which discolors upon reaction with a base and 0.2 g of IRUGACURE 651 as a photopolymerization initiator were dissolved in 15 g of trimethylol propane triacrylate as a polymerizable monomer. 0.2 g of a finely divided powder of the carbonate of tricyclohexyl guanidine as a base precursor was uniformly dispersed in the solution. The dispersion was then added to 30 g of a 10% aqueous solution of polyvinyl alcohol as a binder. 2 g of a 10% solution of sodium dodecylbenzenesulfonate was added to the mixture. The mixture was then subjected to emulsion dispersion to prepare a coating solution. The coating solution was then coated on a high quality paper (meter basis weight: 60 g/m$^2$) by means of a coating bar in a dry weight amount of 5 g/m$^2$ to obtain the coated recording layer. The coated sample was then dried at a temperature of 50° C. for 15 minutes to obtain a light-sensitive heat-sensitive recording material.

The light-sensitive heat-sensitive recording material thus obtained was then exposed to ultraviolet light from a 1,000 W high pressure mercury lamp (Jet Light, manufactured by ORC Co., Ltd.) through a step wedge. The recording material was then heated on a heating plate, the heating plate being at a temperature of 150° C., for 30 seconds. As a result, a sharp magenta image was obtained on the recording material.

EXAMPLE 4

0.09 g of bis[(1-octyl-2-methyl)indole-3-yl]-2-hydroxycarbonylphenyl carbonium dodecylbenzenesulfonate as a spectral sensitizing dye which discolors upon reaction with a base, 0.2 g of IRUGACURE 651 as a photopolymerization initiator and 15 g of vinyl polycinnamate as a photo-crosslinkable resin were dissolved in 70 ml of trichloroethylene and 30 ml of methyl ethyl ketone. 0.2 g of a finely divided powder of the carbonate of tricyclohexyl guanidine as a base precursor was well dispersed in the solution. The dispersion was then coated on a polyethylene terephthalate film (100 μm) in a dry weight amount of 5 g/m$^2$ to obtain the coated recording layer. The coated sample was then dried at a temperature of 50° C. for 15 minutes to obtain a light-sensitive heat-sensitive recording material.

The light-sensitive heat-sensitive recording material thus obtained was then exposed to ultraviolet light from a 1,000 W high pressure mercury lamp (Jet Light, manufactured by ORC Co., Ltd.) through a step wedge. The recording material was then heated on a heating plate, the heating plate being at a temperature of 150° C., for 30 seconds. As a result, a sharp magenta image was obtained on the recording material.

COMPARATIVE EXAMPLE 1

0.09 g of bis[(1-octyl-2-methyl)indole-3-yl]-2-hydroxycarbonylphenyl carbonium perchlorate as a spectral sensitizing dye which discolors upon reaction with a base and 0.054 g of triphenylbutyl borate tetramethyl ammonium salt as a photopolymerization initiator were dissolved in 15 g of trimethylol propane triacrylate as a polymerizable monomer, as in Example 1. 0.2 g of a powder of tricyclohexyl guanidine as a base was added to the solution. As a result, the spectral sensitizing dye was immediately discolored. A recording material was then prepared and evaluated from the solution thus obtained in the same manner as in Example 1. The recording material had no sensitivity to visible light. Color images were not obtained on the recording material.

COMPARATIVE EXAMPLE 2

A recording material was prepared from the same materials and in the same manner as in Example 1 except that 0.09 g of 1,1'-dihexyl-3,3,3',3'-tetramethylindotricarbocyanine iodide as a commonly used spectral sensitizing dye was used in place of the spectral sensitizing dye which discolors upon reaction with a base.

The light-sensitive heat-sensitive recording material thus obtained was then exposed to light from a 500 W xenon lamp through a step wedge (Fuji Step Guide P, trade name, manufactured by Fuji Photo Film Co., Ltd.) and a 550-nm interference filter (Type MIF interference filter, manufactured by Nippon Shinku Kogaku K.K.). The recording material was then heated on a heating plate, the heating plate being at a temperature of 150° C., for over 30 seconds. As a result, the entire surface of the recording material was colored magenta, and no distinct images were obtained thereon.

While the invention has been described in detail and with reference to specific embodiments thereof, it will be apparent to one skilled in the art that various changes and modifications can be made therein without departing from the spirit and scope thereof.

What is claimed is:

1. A light-sensitive heat-sensitive composition consisting essentially of a photohardenable composition comprising a polymerizable vinyl monomer and a photopolymerization initiator, a base precursor which produces a base upon heating, and a colored dye which discolors upon reacting with said base produced upon heating said base precursor, wherein said colored dye is a spectral sensitizing dye for the photopolymerization initiator.

2. A light-sensitive heat-sensitive composition as claimed in claim 1, wherein said base precursor is present in an amount of from 1 to 5 mols per mole of said spectral sensitizing dye.

3. A light-sensitive heat-sensitive composition as claimed in claim 1, wherein said dye has an open lactone ring or an open lactam ring in the molecule thereof and which dye discolors upon reacting with a base to close the ring.

4. A light-sensitive heat-sensitive composition as claimed in claim 3, wherein said base precursor is present as a particulate dispersion.

5. A light-sensitive heat-sensitive composition as claimed in claim 3, wherein said base precursor is microencapsulated.

6. A light-sensitive heat-sensitive recording material comprising a support having provided thereon a recording layer consisting essentially of a photohardenable composition comprising a polymerizable vinyl monomer and a photopolymerization initiator, a base precursor which produces a base upon heating, and a colored dye which discolors upon reacting with said base produced upon heating said base precursor, wherein said colored dye is a spectral sensitizing dye for the photopolymerization initiator.

7. A light-sensitive heat-sensitive recording material as claimed in claim 6, wherein said base precursor is present in an amount of from 1 to 5 mols per mole of said spectral sensitizing dye.

8. A light-sensitive heat-sensitive recording material as claimed in claim 7, wherein said base precursor is microencapsulated.

9. A light-sensitive heat-sensitive recording material as claimed in claim 8, wherein said layer comprises a first layer containing said photohardenable composition and said spectral sensitizing dye and a second layer adjacent to said first layer containing said base precursor.

10. A light-sensitive heat-sensitive recording material as claimed in claim 6, wherein said dye has an open lactone ring or an open lactam ring in the molecule thereof and which dye discolors upon reacting with a base to close the ring.

* * * * *